(12) United States Patent
Diegmann et al.

(10) Patent No.: US 6,621,007 B2
(45) Date of Patent: Sep. 16, 2003

(54) ELECTRICAL CONDUCTOR

(75) Inventors: Wolfgang Diegmann, Wuppertal (DE); Ruediger Tiedeck, Langenfeld (DE); Frank H. Adam, Wuppertal (DE)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/047,429

(22) Filed: Jan. 15, 2002

(65) Prior Publication Data

US 2002/0104677 A1 Aug. 8, 2002

(30) Foreign Application Priority Data

Feb. 5, 2001 (DE) .......................... 101 05 089

(51) Int. Cl.$^7$ ................................. H01B 7/08
(52) U.S. Cl. .................. 174/117 F; 174/117 FF
(58) Field of Search .................. 174/117 F, 117 FF

(56) References Cited

U.S. PATENT DOCUMENTS

| 5,371,324 A | * | 12/1994 | Kanno et al. | ............. 174/117 F |
| 5,527,997 A | * | 6/1996 | Saen et al. | ................ 174/126.2 |
| 6,036,259 A | * | 3/2000 | Hertel et al. | ............. 174/117 F |
| 6,397,438 B1 | * | 6/2002 | DeWan | ........................ 24/306 |

FOREIGN PATENT DOCUMENTS

| DE | 3911017 | 4/1989 |
| DE | 3918314 | 6/1989 |
| DE | 4138714 | 11/1991 |
| DE | 4428708 | 8/1994 |
| DE | 19650227 | 12/1996 |
| DE | 19726887 | 6/1997 |
| DE | 19832486 | 7/1998 |
| DE | 29900924 | 1/1999 |

* cited by examiner

Primary Examiner—Chau N. Nguyen
(74) Attorney, Agent, or Firm—Thomas N. Twomey

(57) ABSTRACT

The invention relates to an electrical conductor having a flat cross-section which has an electrically conducting material which is embedded in an electrically insulating material provided with hooks or loops.

2 Claims, 1 Drawing Sheet

ELECTRICAL CONDUCTOR

TECHNICAL FIELD

The invention relates to an electrical conductor having a flat cross-section which has an electrically conducting material which is embedded in an electrically insulating material.

BACKGROUND OF THE INVENTION

Electrical conductors of this kind are generally known. Such electrical conductors can be provided as, among other things, flexible flat cables (FFC) or flexible printed circuits (FPC). Such electrical conductors are being used, for example, in the automobile industry, where they are laid, for example, between a car roof or a car door and an assembly surface, in particular an interior trim, which has a textile-like surface.

The electrical conductors are typically bonded to the substrate, for example to the interior trim. However, the problem can then arise that the adhesive does not adhere reliably due to silicone oils which are used during the manufacture of the interior trim. Furthermore, bonded electrical conductors cannot be dismantled without problems if, for example, car parts at which such electrical conductors are laid are subjected to material separation and subsequent material recycling in order to reduce waste.

SUMMARY OF THE INVENTION

It is the object of the invention to provide an electrical conductor which can easily be laid in a vehicle compartment.

An electrical conductor comprising an electrically conducting material and an electrically insulating material is provided to satisfy this object. It is characterised in that the electrically insulating material has the hooks or loops of a hook and loop type fastener (a Velcro fastener) on at least one outer side.

On the basis of this formation, such electrical conductors can be fastened to the assembly surfaces provided therefor, in particular to interior trims having textile-like surfaces, by means of a Velcro-like connection. Problematic adhesive bonds thus become superfluous and are replaced by a durable Velcro connection. This means a cheap and fast laying of the electrical conductors in the vehicle compartment which is easy to handle.

Electrical conductors laid in this manner can be removed again in a correspondingly problem-free manner, which is an aspect which represents an increasingly more important cost factor, not only in automobile production, due to environmental requirements, in particular with respect to waste avoidance and the separation and recycling of materials.

Since the outer side of the insulating material is already provided with hooks or loops, no additional material having hooks or loops has to be applied to the electrical conductor, which would cause the thickness of the electrical conductor to increase unnecessarily and which would possibly make it impossible to lay the electrical conductor unobtrusively. Additional manufacturing steps such as the application and drying of adhesive can therefore be omitted and the flat cross-section of the electrical conductor maintained.

Furthermore, applications can be realised in which an interior trim having a fleece-like surface is fastened to an assembly surface, e.g. at the car roof, only by means of a Velcro connection. Electrical conductors provided with hooks and attached to the assembly surface can serve as fastening points for the interior trim.

Advantageous embodiments of the invention are described in the dependent claims, the description and the drawings.

For instance, in accordance with a first advantageous embodiment, the electrically insulating material can have two layers between which the electrically conducting material is located. These layers can be realised by a sandwich-like design in which the electrically conducting material is bonded or laminated between two layers of insulating material.

In a particularly preferred embodiment of the invention, the insulating material comprises a plastic foil provided with hooks or loops or a fabric provided with hooks or loops. Both materials can be manufactured at favourable cost and are easy to process. A common Velcro strip can therefore be used as the insulating material in the simplest case. Since, in comparison with the conventional manufacture of said electrical conductors, common plastic foils or fabrics are only replaced by such which have hooks or loops, no additional process steps arise in the manufacture of electrical conductors in accordance with the invention.

In accordance with a further embodiment of the invention, both outer sides of the electrical conductor have hooks and/or loops. This allows fastening at both sides to appropriately formed interior trims or functional areas.

In a particularly advantageous constructional design, the electrical conductor is a flexible flat cable or a flexible printed circuit. Such electrical conductors can be attached without problem to bent surfaces or surfaces of a three-dimensional character such as occur, for example, in car roofs or car doors.

BRIEF DESCRIPTION OF THE DRAWINGS

The present invention is described below purely by way of example with respect to advantageous embodiments with reference to the enclosed drawings, in which.

DETAILED DESCRIPTION OF THE INVENTION

Figure 1:
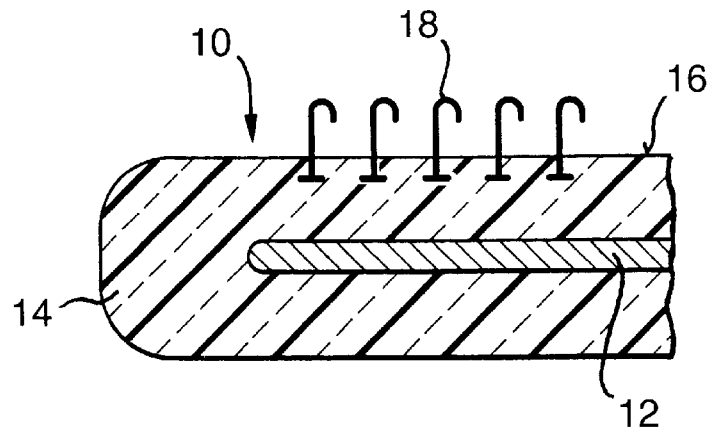
FIG. 1 is a schematic cross-section through a first embodiment of an electrical conductor in accordance with the invention.

FIG. 1 shows a cross-section through an electrical conductor 10, which has an electrically conducting material 12, for example, one or more copper tracks, which is cast in insulating material 14, for example, in a transparent plastic, and which is fully embedded in this electrically insulating material 14.

The electrically insulating material 14 has hooks 18 at its outer side 16 which act as part of a Velcro connection. The hooks 18 were introduced into the insulating material 14 during the manufacturing process and are fixedly anchored therein after the insulating material 14 has solidified. The electrical conductor 10 can be fastened to an assembly surface (not shown), for example a fleece, with the aid of these hooks 18 by the electrical conductor 10 and the assembly surface entering into a Velcro connection.

Figure 2:
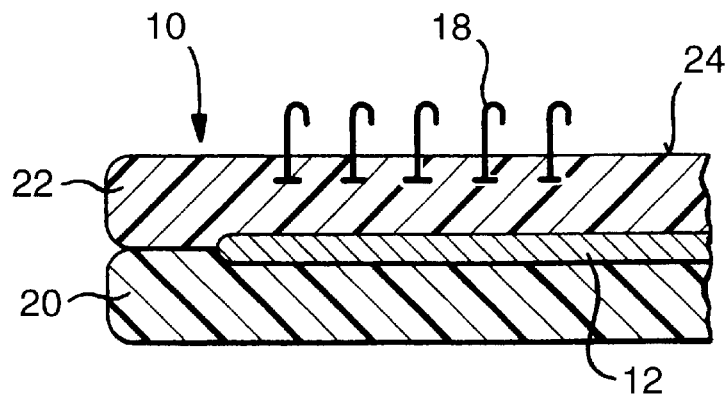
FIG. 2 is a schematic cross-section through a further embodiment of an electrical conductor in accordance with the invention.

FIG. 2 shows an electrical conductor 10, which is embedded between two layers 20, 22 made of an insulating material. The electrical conductor 10 is made by the electrically conducting material 12 being laminated or bonded between the electrically insulating layers 20, 22, with the layers 20, 22 having a foil or a textile band made of plastic. The outer side 24 of the layer 22 is provided with hooks 18 anchored in the layer 22.

Figure 3:
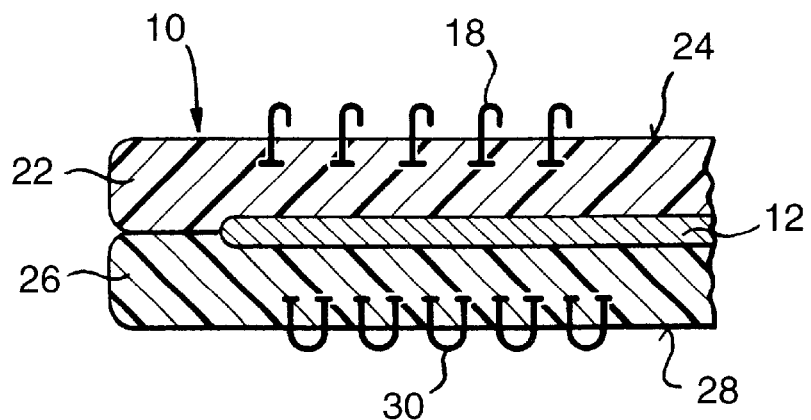
FIG. 3 is a schematic cross-section through a third embodiment of an electrical conductor in accordance with the invention.

An electrical conductor is shown in FIG. 3 in which the electrically conducting material 12 is laminated or bonded between two layers 22, 26 made of different insulating materials, with the layer 22 being provided at its outer side 24 with hooks 18 anchored in the layer 22 and the layer 26 being provided at its outer side 28 with loops 30 anchored in the layer 26. The layers 22, 26 can also be Velcro bands in this embodiment, with the Velcro bands, however, being formed complementary to one another at their outer sides.

Naturally electrical conductors 10 are also feasible in further embodiments (not shown) in which the layers 22, 26 both have the same insulating material and both have hooks or loops at their outer sides 24, 28. A simultaneous fastening to two appropriately formed assembly surfaces is made possible in this way.

What is claimed is:

1. An electrical conductor comprising an electrically conducting material which is embedded in an electrically insulating material, the electrically insulating material having hooks or loops of a hook and loop fastener embedded therein, the electrically insulating material comprising two layers between which the electrically conducting material is located, wherein a first layer of the two layers has hooks and a second layer of the two layers has loops.

2. An electrical conductor comprising an electrically conducting material which is embedded in an electrically insulating material, the electrically insulating material having hooks or loops of a hook and loop fastener embedded therein, the electrically insulating material comprising two layers between which the electrically conducting material is located, wherein a first layer of said two layers comprises a different electrically insulating material from a second layer of said two layers.

* * * * *